United States Patent
Hwang

(10) Patent No.: US 9,070,583 B2
(45) Date of Patent: Jun. 30, 2015

(54) SEMICONDUCTOR DEVICE AND METHOD OF FABRICATING THE SAME

(75) Inventor: Chang Youn Hwang, Icheon-si (KR)

(73) Assignee: HYNIX SEMICONDUCTOR INC, Icheon (KR)

( * ) Notice: Subject to any disclaimer, the term of this patent is extended or adjusted under 35 U.S.C. 154(b) by 708 days.

(21) Appl. No.: 13/230,787

(22) Filed: Sep. 12, 2011

(65) Prior Publication Data

US 2012/0001333 A1    Jan. 5, 2012

Related U.S. Application Data

(62) Division of application No. 12/495,607, filed on Jun. 30, 2009, now Pat. No. 8,034,714.

(30) Foreign Application Priority Data

Jun. 22, 2009   (KR) .................. 10-2009-0055520

(51) Int. Cl.
*H01L 29/72*   (2006.01)
*H01L 27/108*   (2006.01)
*H01L 21/768*   (2006.01)

(52) U.S. Cl.
CPC .... *H01L 27/10888* (2013.01); *H01L 21/76897* (2013.01); *H01L 27/10855* (2013.01)

(58) Field of Classification Search
CPC ................................................ H01L 21/76843
USPC ..................... 257/751, E23.157; 365/163
See application file for complete search history.

(56) References Cited

U.S. PATENT DOCUMENTS

| 6,177,320 | B1 | 1/2001 | Cho et al. |
| 2005/0095868 | A1 | 5/2005 | Park et al. |
| 2007/0023784 | A1 | 2/2007 | Schloesser |
| 2008/0283957 | A1 | 11/2008 | Kang et al. |
| 2009/0034323 | A1* | 2/2009 | Lung et al. ................... 365/163 |
| 2009/0068809 | A1* | 3/2009 | Seo et al. ..................... 438/299 |

FOREIGN PATENT DOCUMENTS

| CN | 1222753 A | 7/1999 |
| CN | 1612325 A | 5/2005 |
| CN | 1905161 A | 1/2007 |
| CN | 101192561 A | 6/2008 |
| CN | 101308812 A | 11/2008 |
| KR | 100756807 B1 | 8/2007 |
| KR | 1020080084064 A | 9/2008 |
| KR | 1020080088909 A | 10/2008 |

* cited by examiner

*Primary Examiner* — Edward Wojciechowicz

(57) ABSTRACT

Provided are a semiconductor device and a method of fabricating the semiconductor memory device. A contact plug is formed by wet etching. An aspect ratio of SAC is decreased and SAC fail is reduced so that a process margin is secured. The semiconductor device includes a semiconductor substrate comprising an active region and a device isolation layer defining the active region, a conductive pattern formed on the semiconductor substrate, and a nitride layer formed on the semiconductor substrate perpendicularly to the conductive pattern.

10 Claims, 5 Drawing Sheets

(a)       (b)

(a)  (b)

(a)  (b)

(a) (b)

(a) (b)

SEMICONDUCTOR DEVICE AND METHOD OF FABRICATING THE SAME

CROSS-REFERENCE TO RELATED APPLICATION

The present application claims priority to Korean patent application number 10-2009-0055520, filed on Jun. 22, 2009, which is incorporated by reference in its entirety.

BACKGROUND OF THE INVENTION

The present invention relates to a semiconductor device and, more particularly, to a semiconductor device in which a contact plug is formed by a self-aligned contact process and a method of fabricating the semiconductor device.

As a degree of integration increases for a semiconductor device, a process margin has been gradually decreased. Accordingly, a self-aligned contact (SAC) process is mainly used to form a contact plug for connecting a drain and a bit line, and a source and a storage electrode. Also, to further increase the process margin during the SAC process, a landing plug contact (LPC) (i.e., a type of contact pad) is formed on a contact area.

Even though a dry etch method using a high etch selectivity ratio is used for the SAC process, it is still difficult to secure a sufficient etch selectivity ratio. Thus, to prevent SAC fail (i.e., a phenomenon where a gate structure or a bit line is etched when the contact hole is etched) a hard mask formed of a nitride layer is thickly deposited on the gate structure or the bit line. As a result, the aspect ratio of a semiconductor structure increases so that the process margin decreases accordingly. This could lead to manufacturing problems, for example, the contact hole is not formed open during the formation of a contact.

BRIEF SUMMARY OF THE INVENTION

Various embodiments of the invention are directed to providing a semiconductor device in which a nitride layer is formed on a semiconductor substrate perpendicularly to a conductive pattern to form a contact plug by wet etching so that the aspect ratio of a self-align contact is decreased and SAC fail is reduced, thereby securing a process margin, and a method of fabricating the semiconductor device.

According to an aspect of the present invention, a semiconductor device includes a semiconductor substrate comprising an active region and a device isolation layer defining the active region, a conductive pattern formed on the semiconductor substrate, and a nitride layer formed on the semiconductor substrate perpendicularly to the conductive pattern. Thus, since a landing plug contact may be formed by wet etching, an aspect ratio of a SAC may be decreased. The conductive pattern may be a gate or a bit line.

The nitride layer may be a low pressure (LP) nitride. Thus, the nitride layer may not be etched in a wet etching process for forming a contact hole.

The semiconductor device may further include a landing plug contact that is formed in a junction area of the active region. The semiconductor device may further include a bit line contact and a storage electrode contact that are formed in a junction area of the active region.

The semiconductor device may further include a contact spacer that is formed of a nitride layer material on side walls of the conductive pattern and the nitride layer. Thus, the contact spacer functions as an etch barrier during the forming of a landing plug contact hole.

The conductive pattern may include a polysilicon layer, a barrier metal layer formed on the polysilicon layer, a tungsten layer formed on the barrier metal layer, and a gate hard disk mask layer formed on the tungsten layer. The barrier metal layer may be formed of any one of WSiN, WN, and Ti. The polysilicon layer, the barrier metal layer, and the tungsten layer are, respectively, formed to have thicknesses of 400 Å-1000 Å, 20 Å-120 Å, and 400 Å-1000 Å.

The semiconductor device may further include a spacer that is formed of a nitride layer and on a side wall and an upper surface of the conductive pattern to protect a gate structure.

The semiconductor device may further include a bit line contact and a bit line, and a storage electrode contact and a storage electrode, which are formed above the landing plug contact, thereby completing the semiconductor device.

According to another aspect of the present invention, a method of fabricating a semiconductor device includes forming an active region and a device isolation layer on a semiconductor substrate, forming a conductive pattern on the semiconductor substrate, and forming a nitride layer on the semiconductor substrate perpendicularly to the conductive pattern. Thus, since a landing plug contact may be formed by wet etching, an aspect ratio of a SAC may be decreased.

The method may further include forming a landing plug contact in a junction area of the active region. The method may further include a bit line contact and a storage electrode contact in a junction area of the active region.

The forming of the nitride layer may further include forming an interlayer insulation layer on the semiconductor substrate, forming a trench by etching the interlayer insulation layer, filling the trench with an insulation layer, and removing the interlayer insulation layer.

In the forming of the trench by etching the interlayer insulation layer, $CF_4$, $CHF_3$, $O_2$, Ar, $N_2$, $C_4F_8$, $C_4F_6$, and $CH_2F_2$ may be used as an etch gas.

The filling of the nitride layer may include depositing a low pressure (LP) nitride layer on an entire surface of the interlayer insulation layer where the trench is formed, and etching an upper portion of the LP nitride layer using a gas such as $CF_4$, $CHF_3$, $O_2$, Ar, and $N_2$.

The removing of the interlayer insulation layer is performed by wet etching using a buffered oxide echant (BOE).

After the forming of the conductive pattern, the method may further include forming an etch stop layer on a surface of the semiconductor substrate. Thus, the semiconductor device is protected.

Before the forming of the nitride layer, the method may further include removing the etch stop layer. Thus, a junction area of the semiconductor substrate where a contact is to be formed may be open.

In the removing of the etch stop layer, the etch stop layer may be etched using a gas such as $CF_4$, $CHF_3$, $O_2$, Ar, and $N_2$.

The method may further include a bit line contact and a bit line, and a storage electrode contact and a storage electrode that are formed above the landing plug contact.

The method may further include a contact spacer formed of a nitride layer material on side walls of the conductive pattern and the nitride layer. Thus, a contact plug material may be easily buried.

The method may further include forming a spacer formed of a nitride layer material on a side wall and an upper surface of the conductive pattern. Thus, the conductive pattern may be protected.

DESCRIPTION OF EMBODIMENT

Hereinafter, an embodiment of the present disclosure will be described in detail with reference to the accompanying drawings.

Figure 1:
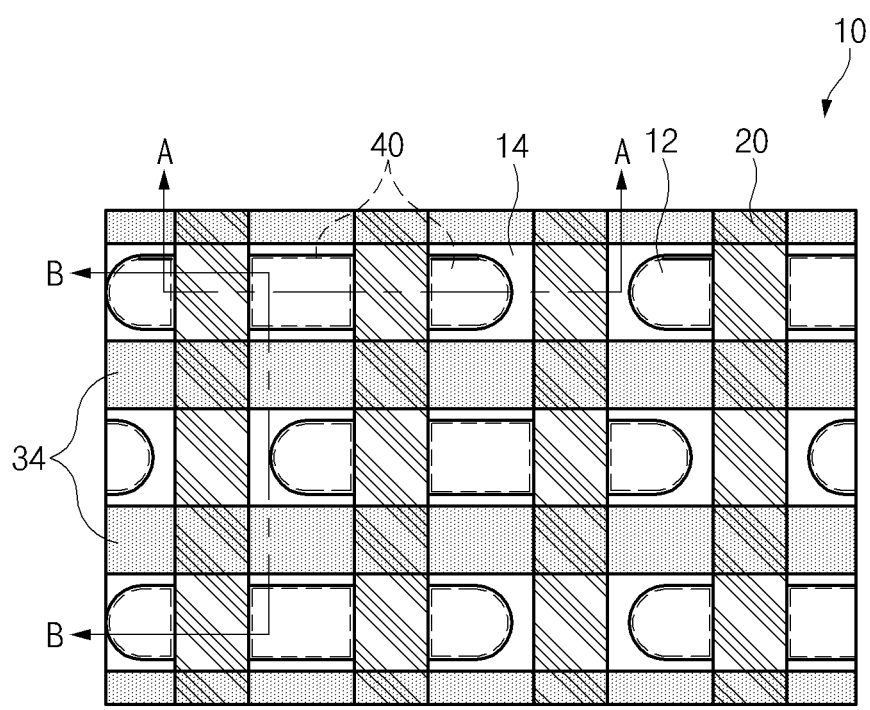
FIGS. 1 and 2 are plan views of a semiconductor device according to an embodiment of the present invention.
Figure 2:
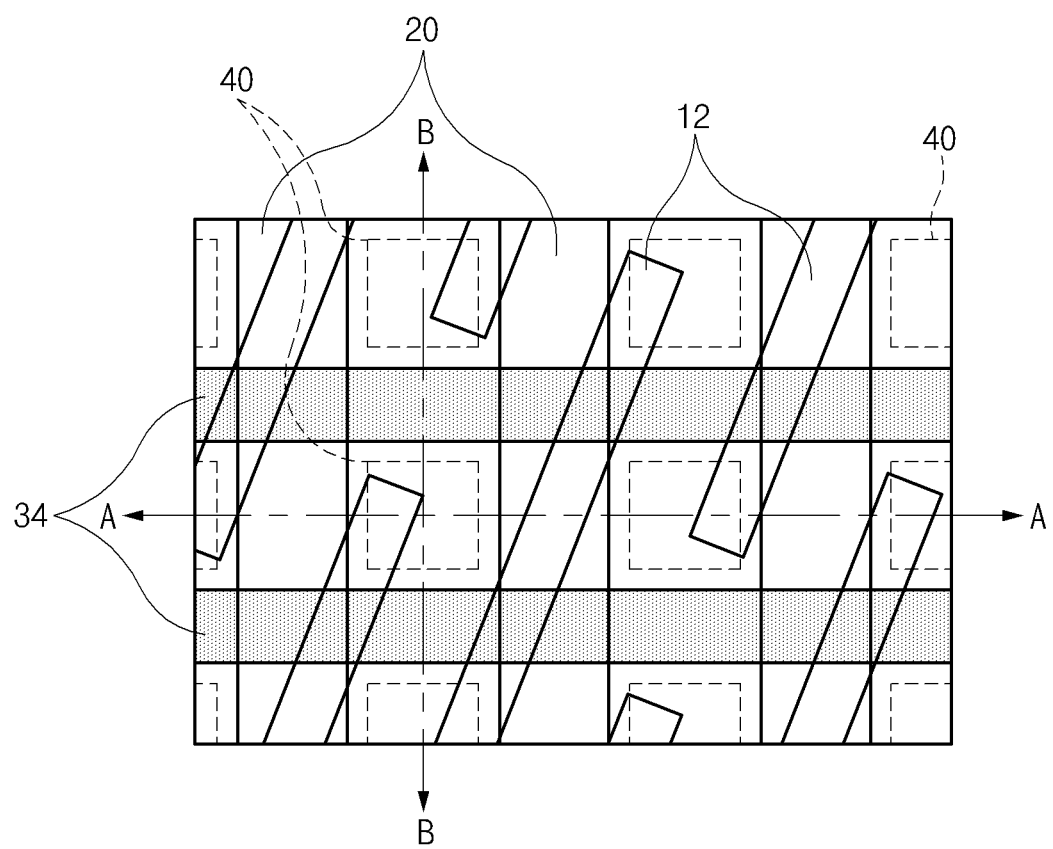

FIGS. 1 and 2 are plan views of a semiconductor device according to an embodiment of the present invention. FIG. 1 illustrates a semiconductor device according to an embodiment of the present invention, formed on an 8F2 layout. FIG. 2 illustrates a semiconductor device according to an embodiment of the present invention, formed on a 6F2 layout. Referring to FIGS. 1 and 2, a device isolation layer 14 defining an active region 12 is formed on a semiconductor substrate 10. A plurality of conductive patterns 20 are formed on the semiconductor substrate 10 so that two conductive patterns 20 intersect each active region 12.

In each active region 12, a contact plug 40 is formed between the conductive patterns 20. In detail, three landing plugs are formed for each active region 12 in the 8F2 layout of FIG. 1, and two storage electrode contact plugs are formed for each active region 12 in the 6F2 layout of FIG. 2. A nitride layer 34 is formed in an upper portion of the semiconductor substrate 10, perpendicular to the conductive patterns 20. Although they are not illustrated in the drawings, a bit line contact plug and a bit line (not shown), and a storage electrode contact plug and a storage electrode (not shown) are formed above the contact plugs 40 of FIG. 1.

The nitride layer 34 and the conductive patterns 20 together define a contact hole wherein the contact plug 40 is to be formed. The use of two different materials to define the contact hole enables the use of a wet etch step to form the contact hole instead of a dry etch step as in the conventional method. In a conventional structure without the nitride layer 34, an interlayer insulation layer (not shown), for which etching is easier than the nitride layer 34, is formed at a position where the nitride layer 34 of the present invention is formed. In a conventional semiconductor device, when a contact hole of the contact plug 40 is formed by wet etching, the interlayer insulation layer is etched together so that the neighboring contact plugs 40 may be short circuited.

However, in the present embodiment, the contact plug is formed in a region defined by the conductive patterns 20 and the nitride layer 34(Although it is not illustrated in FIGS. 1 and 2, a nitride spacer is formed around the conductive patterns 20). The region defined by the conductive pattern 20 and the nitride layer 34 may be a square, a rectangle, or other shapes. Since the conductive patterns 20 and the nitride layer 34 function as an etch barrier when the interlayer insulation layer over the square region is etched, the interlayer insulating layer over the neighboring contact plug provides an etch protection so a hard mask pattern on the neighboring contact plug or a gate does not need to be thick.

Compared to dry etching, the contact hole may be etched more reliably with less damage. The aspect ratio of the contact hole may also be decreased since the contact hole can have a bigger opening and the insulating layer may be provided to have a lesser thickness.

The semiconductor device of the present embodiment also includes other elements such as an etch-stop layer 16, a spacer 22, and a contact spacer 42, as described below.

FIGS. 3-8 sequentially illustrate a method of fabricating a semiconductor device according to an embodiment of the present invention. In FIGS. 3-7, and 8A, views denoted as (a) are cross-sectional views taken along a line A-A, and views denoted as (b) are cross-sectional views taken along a line B-B of FIGS. 1 and 2.

Figure 3:
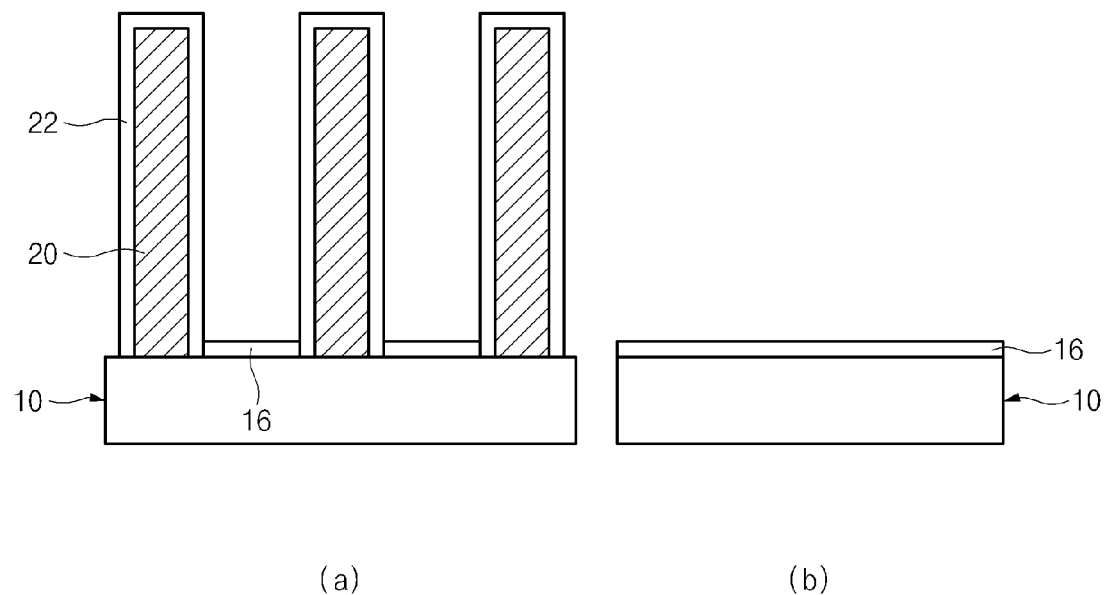
FIGS. 3 to 8 are cross-sectional views showing a method of fabricating a semiconductor device according to an embodiment of the present invention.

Referring to FIGS. 1-3, the device isolation layer 14 for defining the active region 12 is formed on the semiconductor substrate 10. The device isolation layer 14 is formed by a shallow trench isolation (STI) process. Although the device isolation layer 14 may be formed of an oxide layer, or a stack pattern of SOD and HDP.

The conductive patterns 20 are formed on the semiconductor substrate 10 such that two conductive patterns intersect each active region 12 in the present embodiment. Although it is not illustrated in the drawings, the conductive patterns 20 (see FIG. 3) may be formed of a stack pattern of a tungsten (W) layer and a polysilicon layer. A barrier metal layer (e.g., WSiN, WN, or Ti) may also be formed between the polysilicon layer and the tungsten layer. The polysilicon layer, the barrier metal layer, and the tungsten layer are formed, respectively, to have thicknesses of 400 Å-1000 Å, 20 Å-120 Å, and 400 Å-1000 Å.

The conductive pattern 20 is used to define a gate in the 8F2 layout of FIG. 1 and a bit line in the 6F2 layout of FIG. 2. In the 6F2 layout of FIG. 2, the gate is a recessed gate that is buried in the semiconductor substrate 10.

A hard mask layer (e.g., a nitride layer) is formed on the conductive pattern 20 with a thickness of 500 Å-1000 Å. Accordingly, compared to the conventional structure, which has a thickness of more than at least 1000 Å the thickness of the hard mask layer is much thinner and the aspect ratio of the contact hole is significantly smaller so that an etch margin may be improved. This is because the present invention uses the nitride layer 34 (see FIG. 1) as an etch mask and the contact hole for the contact plug 40 (see FIG. 1) is formed by wet etching. That is, in the conventional method, the insulating layer (e.g., an oxide layer) of the same type is formed over both the contact hole region and the device isolation layer between neighboring conductive patterns (20). In the present embodiment, however, the insulating layer (e.g., a nitride layer) formed over the device isolation layer between the neighboring conductive patterns (20) is different from the insulating layer (e.g., an oxide layer) formed over the contact hole region.

As illustrated in FIG. 3, the spacer 22 is formed on the top and the sides of the conductive patterns 20. The spacer 22 is formed of a nitride layer having a thickness of 100 Å-300 Å which prevents the conductive pattern 20 from being etched in the subsequent wet etching process.

The etch-stop layer 16 is formed over a region where t the contact plug is supposed to be formed. In the present embodiment, the etch-stopping layer 16 is formed over the entire surface of the substrate 10. The etch-stop layer 16 is formed of a nitride layer so as to protect the semiconductor substrate 10 (or an underlying layer) from being etched during the formation of the contact hole of the contact plug 40. The etch-stop layer 16 may be formed together with the spacer 22. For example, a nitride layer may be formed on the semiconductor substrate 10 and the conductive patterns 20 with a given thickness, and then removed by an etch back process, leaving the gate spacer 22 and the etch stop layer 16.

Figure 4:
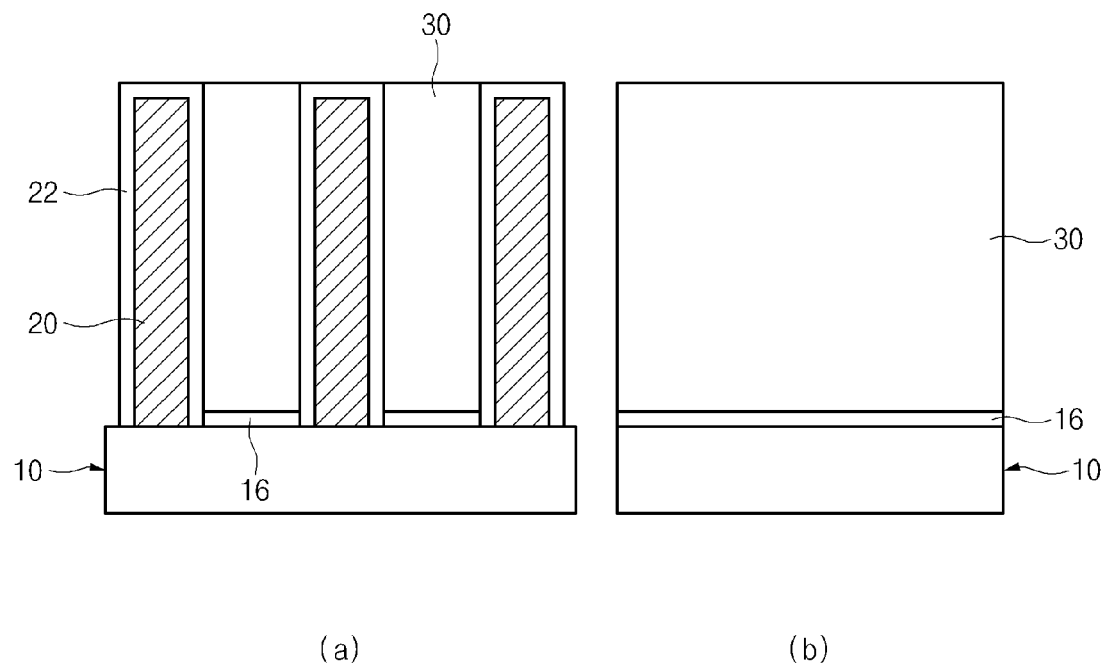

Next, referring to FIG. 4, an interlayer insulation layer 30 is deposited to have a thickness of 3000 Å-8000 Å using material different from the insulating layer formed between neighboring contact plug 40 (a nitride layer 34 according to this embodiment) on the entire surface of a structure where the spacer 22 and the etch-stop layer 16 are formed. Then, the interlayer insulation layer 30 is etched using a chemical mechanical polishing (CMP) process or an etch-back process until the spacer 22 is exposed. The interlayer insulation layer formed of BPSG may be obtained by flowing borophospho silicate glass (BPSG) at a temperature of 700° C. for 40 minutes or more.

Figure 5:
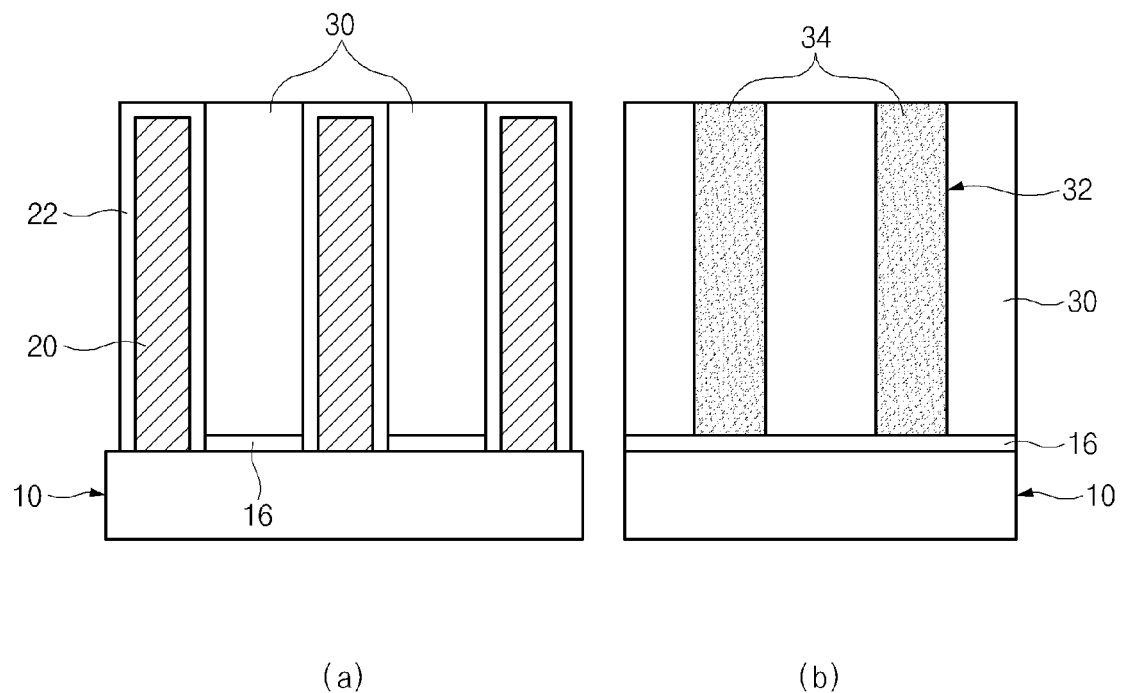

As illustrated in FIG. 5, the interlayer insulation layer 30 is etched to form a trench 32 configured to be perpendicular to the conductive patterns 20. The trench 32 is filled with a nitride layer 34.

In detail, after a photoresist pattern (not shown) is formed that is open in the area of the device isolation layer 14 where the conductive patterns 20 are not formed. The interlayer insulation layer 30 is then etched using the photoresist pattern as a mask, thereby forming the trench 32. An etch gas such as $CF_4$, $CHF_3$, $O_2$, Ar, $N_2$, $C_4F_8$, $C_4F_6$, and $CH_2F_2$ may be used in the process of etching the interlayer insulation layer 30. A low pressure (LP) nitride layer is deposited on the resulting structure to fill the trench 32. The nitride layer 34 on the upper portion of the interlayer insulation layer 30 is etched using $CF_4$, $CHF_3$, $O_2$, Ar, $N_2$, or a combination gas thereof so that the height of the nitride layer 34 may be the same as that of the spacer 22.

Figure 6:
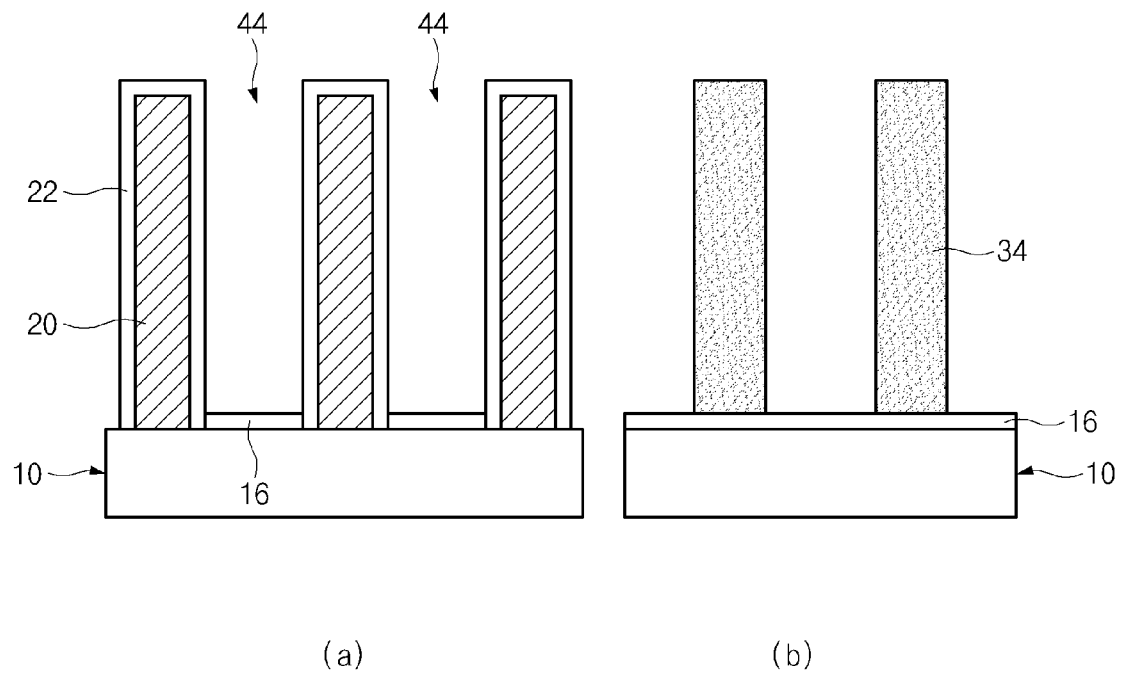

Next, referring to FIG. 6, the interlayer insulation layer 30 on the semiconductor substrate 10 is etched away so that a contact hole 44 may be formed on the region defined by the conductive patterns 20 and the nitride layer 34. The interlayer insulation layer 30 is etched by wet etching (e.g., using a buffered oxide echant (BOE) that is a mixture of $NH_4F$ and HF). Since the nitride layer 34, the spacer 22, and the etch stop layer 16 are not etched during the etching of the interlayer insulation layer 30, the conductive pattern 20 and the semiconductor substrate 10 are protected.

Using wet etching in the process of forming the contact hole 44 is a characteristic of the present invention in comparison with a related art. The spacer 22 on the conductive pattern 20 (shown horizontally in FIG. 1) and the nitride layer 34 (shown vertically in FIG. 1), functioning as an etch barrier, prevent the sidewall of the contact hole 32 from being over-etched to damage an adjacent element (e.g., a neighboring conductive pattern 20). Thus, the wet etching used in the present embodiment provides the contact plugs and enable them to have a substantially uniform profile. The present embodiment uses the different etch characteristics of the two layers (the oxide layer 30 and the nitride layer 34) to etch the oxide layer 30 defined by the nitride layer 34 and the conductive pattern 20 to form the contact hole. In another embodiment, a dry etch (e.g., isotropic etch) may be used to form the contact hole instead of the wet etch step.

Also, the hard mask layer formed over the conductive pattern 20 can be formed to be thin because a wet etching process has a relatively high etch selectivity ratio compared with a conventional anisotropic dry etching process. As a result, the aspect ratio is reduced, and a more generous etch margin may be obtained, thus making a gate SAC fail less likely.

Figure 7:
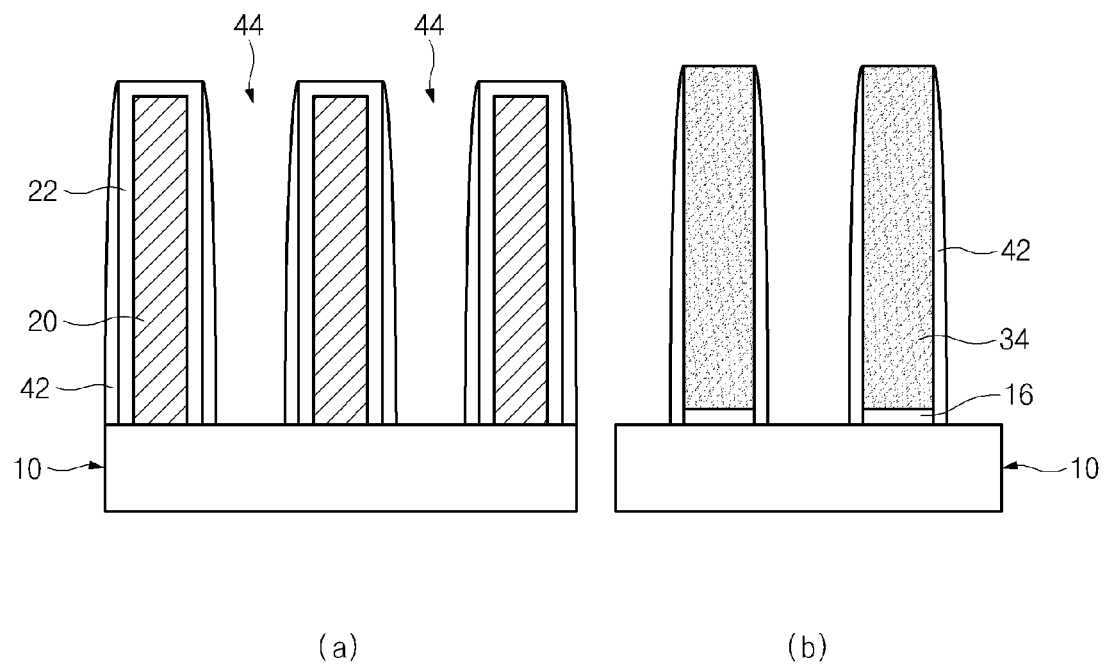

Then, as illustrated in FIG. 7, the etch stop layer 16 on the bottom of the contact hole 44 is removed to open a junction area for a source or a drain of the semiconductor substrate 10, then a contact spacer 42 is formed on the sidewalls of the spacer 22 and on the sidewalls of the nitride layer 34. In detail, the etch stop layer 16 on the bottom of the contact hole 44 is etched using a gas such as $CF_4$, $CHF_3$, $O_2$, Ar, $N_2$ or a combination thereof and the contact spacer 42 is formed of a nitride layer having a thickness of 100 Å-300 Å. And the contact spacer 42 can be formed by depositing a layer comprising the contact spacer 42 material and etching-back the layer.

Figure 8:
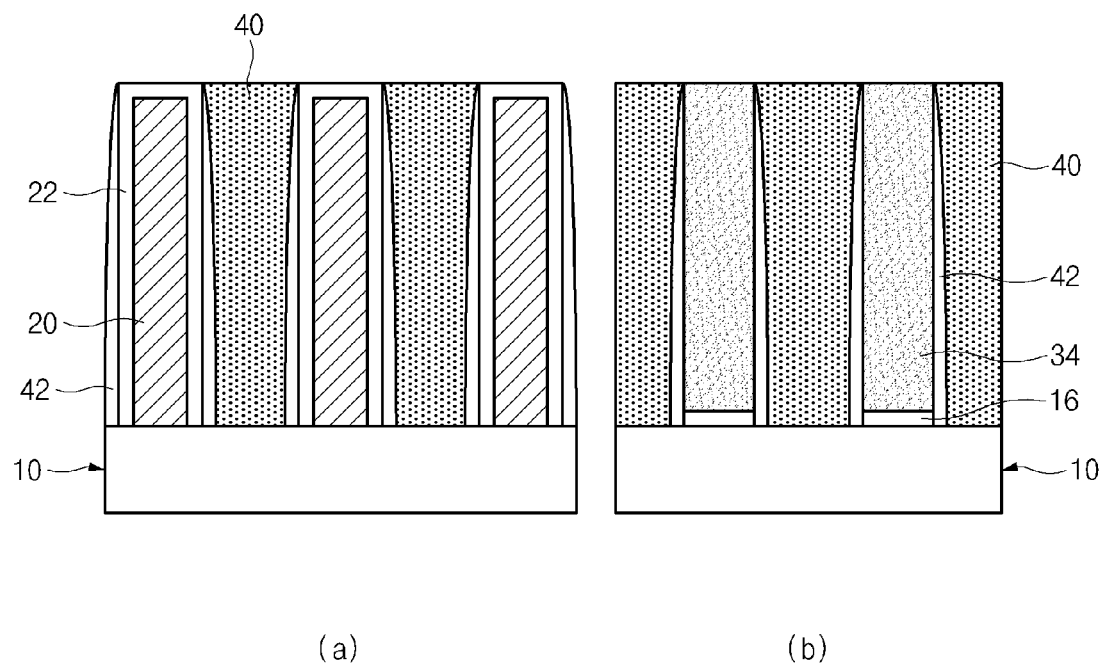

Next, referring to FIG. 8, polysilicon is deposited to a thickness of 500 Å-2000 Å on the entire surface of a structure including within the contact hole 44. Then, the upper portion of the polysilicon is removed by CMP or etch back to form the contact plug 40.

Through the above processes, the semiconductor device of FIG. 1 or 2 is formed. Although it is not illustrated, a bit line contact plug and a bit line (not shown), and a storage electrode contact plug and a storage electrode (not shown), are formed above the contact plug 40 (or a landing plug) of FIG. 1. The storage electrode is formed over the contact plug 40 directly or indirectly via a storage electrode contact plug, of FIG. 2 so as to be electrically coupled with each other.

Although in the above description the method of forming a contact plug by a SAC process and a semiconductor device fabricated by the method are discussed, the present invention is not limited thereto. When the nitride layer is used according to the present invention, the bit line contact and the storage electrode contact may be directly formed over the junction area to be electrically coupled therewith out forming the landing plug.

The above embodiment of the present invention is illustrative and not limitative. Various alternatives and equivalents are possible. The invention is not limited by the embodiment described herein. Nor is the invention limited to any specific type of a semiconductor device. Other additions, subtractions, or modifications are obvious in view of the present disclosure and are intended to fall within the scope of the appended claims.

What is claimed is:

1. A semiconductor device comprising:
   a substrate having active regions, each of the active regions including first and second conductive regions;
   conductive line patterns disposed over the substrate, each conductive line pattern passing between the first and the second conductive regions;
   nitride patterns disposed between the conductive line patterns and arranged in a line shape; and
   a contact plug provided in a region defined by the conductive line patterns and the nitride patterns, the contact plug coupled to any of the first and second conductive regions,
   wherein the nitride patterns are disposed perpendicular to the conductive line patterns.

2. The semiconductor device of claim 1, wherein the conductive line patterns and the nitride patterns have substantially the same height.

3. The semiconductor device of claim 1, wherein the nitride patterns include a low pressure (LP) nitride.

4. The semiconductor device of claim 1, further comprising:
   a first spacer that is disposed over sidewalls and top of the conductive line patterns.

5. The semiconductor device of claim 1, wherein the conductive line patterns comprise:
   a polysilicon layer;
   a barrier metal layer disposed over the polysilicon layer; and
   a tungsten layer disposed over the barrier metal layer.

6. The semiconductor device of claim 4, further comprising:
   a second spacer disposed over the first spacer and sidewalls of the nitride patterns.

7. The semiconductor device of claim 1, wherein each of the conductive line patterns comprises a word line or a bit line.

8. The semiconductor device of claim 1, further comprising an etch stop layer disposed between the nitride patterns and the substrate.

9. The semiconductor device of claim 1, wherein the region is defined by two adjacent nitride patterns and two adjacent conductive line patterns.

10. The semiconductor device of claim 1, wherein the nitride patterns are at the same level as that of the conductive line patterns.

* * * * *